US011520951B2

(12) United States Patent
Qiao et al.

(10) Patent No.: US 11,520,951 B2
(45) Date of Patent: Dec. 6, 2022

(54) METHOD FOR EVALUATING ECOLOGICAL ENVIRONMENTAL IMPACT OF CHANNEL PROJECT AND COUNTERMEASURES THEREOF BASED ON MECHANISM ANALYSIS

(71) Applicant: China Waterborne Transport Research Institute, Beijing (CN)

(72) Inventors: Bing Qiao, Beijing (CN); Chunling Liu, Beijing (CN); Xuan Wu, Beijing (CN); Jinpeng Li, Beijing (CN); Xueyuan Ji, Beijing (CN); Mingbo Chen, Beijing (CN); Shiyue Wang, Beijing (CN); Yue Li, Beijing (CN)

(73) Assignee: China Waterborne Transport Research Institute, Beijing (CN)

( * ) Notice: Subject to any disclaimer, the term of this patent is extended or adjusted under 35 U.S.C. 154(b) by 371 days.

(21) Appl. No.: 16/822,544

(22) Filed: Mar. 18, 2020

(65) Prior Publication Data
US 2020/0311319 A1   Oct. 1, 2020

(30) Foreign Application Priority Data

Mar. 28, 2019   (CN) .......................... 201910240240.1

(51) Int. Cl.
*G06F 30/13* (2020.01)
*G06K 9/62* (2022.01)
*E02D 1/02* (2006.01)

(52) U.S. Cl.
CPC ............... *G06F 30/13* (2020.01); *E02D 1/02* (2013.01); *G06K 9/6267* (2013.01)

(58) Field of Classification Search
None
See application file for complete search history.

(56) References Cited

U.S. PATENT DOCUMENTS

2013/0216089 A1*   8/2013   Chen .................... G06T 7/0002
382/100

OTHER PUBLICATIONS

Glasson et al.; Introduction to Environmental Impact Assessment, 2012 Routledge 4th Edition; pp. 3-27 (Year: 2012).*

(Continued)

*Primary Examiner* — Peter Hoang
(74) *Attorney, Agent, or Firm* — Cooper Legal Group, LLC

(57) ABSTRACT

The present invention relates to a method for evaluating an ecological environmental impact of a channel project and countermeasures thereof based on mechanism analysis, belonging to the field of ecological environmental impact evaluation technologies. In view of limitations of an existing evaluation method and the void of related technologies, the method includes: a project construction verification and change analysis method, a method for analyzing a fine classification impact mechanism and countermeasures thereof, a method for establishing a multi-level comprehensive index system of ecological environmental impacts, a method for establishing a compliance evaluation index system of an ecological channel, a method for tracking, monitoring and evaluation based on long-term time series satellite remote sensing and a method for analyzing and evaluating a superimposed and cumulative impact model.

2 Claims, 1 Drawing Sheet

(56) References Cited

OTHER PUBLICATIONS

Tullos; Assessing the influence of environmental impact assessments on science and policy; An analysis of the Three Gorges Project; Jul. 2009 Journal of Environmental Management, vol. 90, Supplements, pp. S208-S223 (Year: 2009).*
Liu Huaihan et al., "Ecological Measures and Technology Outlook for Yangtze River Main Line Channel Regulation", Jan. 2016, p. 114-118, Port and Waterway Engineering. With English Abstract.
Dai Mingxin, "Dumping of Dredged Mud on Marine Ecological Environment in 300,000 Ton Channel Project of Zhanjiang Port", p. 9-11, 26(3), Traffic Environmental Protection. With English Abstract.
"Technical Guidelines for Environmental Impact Assessment Ecological Impact HJ19-2011", Sep. 1, 2011. Concise explanation incorporated in applicant's specification.
Liu Zhenqi, et al., "Environmental Impact Assessment for Oceanic Projects", 2012, China Environmental Science Press. Concise explanation incorporated in applicant's specification.
Huan Ban Zheng, "General Technical Guidelines for Identification and Assessment of Eco-Environmental Damage", 2016, No. 67, Ministry of Environmental Protection. Concise explanation incorporated in applicant's specification.
Liu Zhenqi, et al., "Environmental Impact Assessment for Transportation", China Environmental Science Press, 2011. Concise explanation incorporated in applicant's specification.

\* cited by examiner

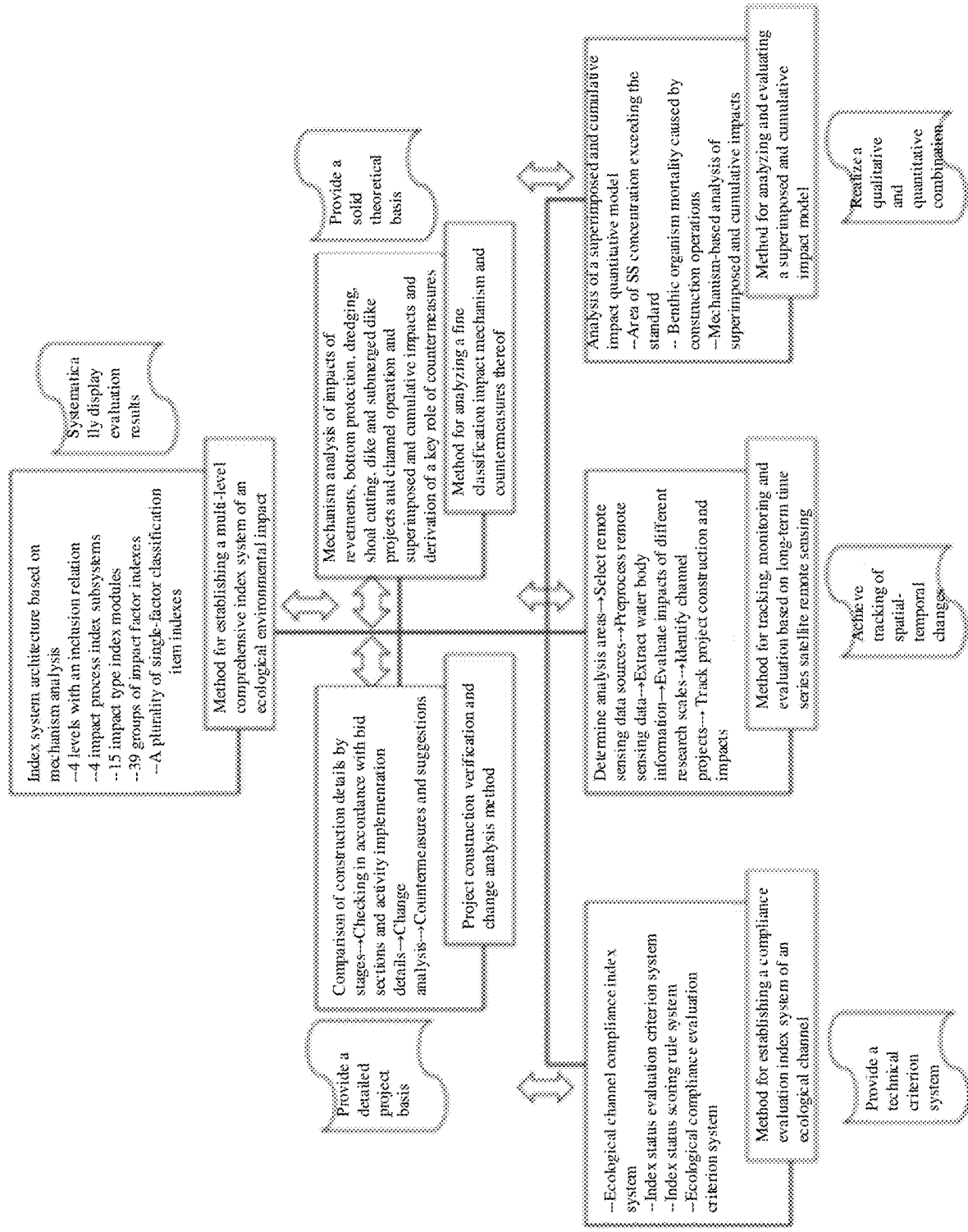

METHOD FOR EVALUATING ECOLOGICAL ENVIRONMENTAL IMPACT OF CHANNEL PROJECT AND COUNTERMEASURES THEREOF BASED ON MECHANISM ANALYSIS

RELATED APPLICATION

This application claims the benefit of priority from Chinese Patent Application No. 201910240240.1, filed on Mar. 28, 2019. The content of the aforementioned application, including any intervening amendments thereto, is incorporated herein by reference in its entirety.

TECHNICAL FIELD

The present invention relates to a method for evaluating an ecological environmental impact of a channel project and countermeasures thereof based on mechanism analysis, belonging to the field of ecological environmental impact evaluation technologies.

BACKGROUND

Shipping, as an important mode of transportation, is advantageous in less space occupation, low cost, low energy consumption, light pollution, large transportation capacity, high efficiency, etc. Therefore, shipping has been undertaken for heavy passenger and freight transportation tasks, especially the transportation of global resources and materials.

It is reported that the cost of shipping is only ¼ that of road transportation and ½ that of railway transportation. The environmental pollution caused by road and railway transportation is 23 times and 3.3 times that of shipping respectively. Therefore, all countries in the world attach great importance to the development of ocean, coastal and river shipping functions. Taking rivers as an example, in order to further enhance their shipping capacity and benefits, Europe has launched large-scale channel regulation projects for the Rhine River, the United States for the Mississippi River, Russia for the Volga River, France for the Rhone River, China for the Yangtze River, etc.

However, in conventional channel regulation projects, more attention is often paid to the effect and stability of the project. Environmental impact assessment (EIA) is usually conducted according to law in the planning and feasibility study stages in order to go through the examination and approval procedures for construction projects. Environmental supervision is conducted during the project construction period and environmental protection acceptance investigation is implemented during the trial operation period upon completion in accordance with regulations. However, in other cases, nearly no systematic research investigation and tracking evaluation are conducted on the ecological environmental impact brought by the regulation projects. It is also rare to guide and perfect the planning, design and implementation of ecological environment protection and restoration countermeasures through impact and countermeasure evaluation based on mechanism analysis. The relevant impact and countermeasure evaluation methods are relatively general and limited. For example:

(1) The industry standard *Technical Guidelines for Environmental Impact Assessment—Ecological Environment* (HJ 19-2011) offers advice on investigating and analyzing various project details and the current situation of the ecological environment. The scope, intensity and duration of the impact on the ecological system should be determined by analyzing the mode, scope, intensity and duration of the impact, and the trend of changes in the composition and service functions of the ecological system should be predicted, focusing on the adverse impacts, irreversible impacts and cumulative ecological impacts. The standard does not propose further detailed evaluation methods and details.

(2) Vocational training materials for environmental impact assessment engineers put forward methods for quantitative assessment of an ecological environmental impact related to channel projects, including: how to estimate benthic organism loss according to the construction scope, how to predict the increment and scope of concentration of suspended solids in water, how to quantitatively estimate losses of phytoplankton, fish eggs and larva fish, and fishery resources according to simulation prediction results, and the like. This provides background technology for further refining the ecological environmental impact mechanism of channel projects and enriching and perfecting the quantitative assessment methods accordingly. (*Environmental Impact Assessment for Transportation* (Part I) (Chapter II: Ports, Docks, Channels and Warehousing Projects, Written by Liu Zhenqi, Luo Xianqing, Qiao Bing, Li Xiangyang, et al, China Environmental Science Press, 2011), Environmental Impact Assessment for Marine Engineering (Written by Liu Zhenqi, Qiao Bing, Dong Zhenfang, et al., China Environmental Science Press, 2012))

(3) *The General Technical Guidelines for Identification and Assessment of Eco-Environmental Damage* issued by the former Ministry of Environmental Protection stipulates the general principles, procedures, details and methods of identification and assessment of ecological environmental damage. Its causal analysis details include: based on investigation results of environmental pollution and ecological destruction behaviors and ecological damage facts, analyzing whether there is a causal relationship between the environmental pollution or ecological destruction behaviors and ecological damage; real object damage quantification details include: comparing the difference between the damaged ecological environment and the baseline, determining the scope and degree of ecological damage, and calculating the quantity of real objects subjected to ecological damage. The quantitative details of damage value include: choosing an alternative equivalent analysis method. This document does not propose further details. (Ministry of Environmental Protection, Huan Ban Zheng Fa [2016] No. 67)

(4) Liu Huaihan et al. elaborated on the response of Yangtze River channel regulation to ecology in the article *Ecological Measures and Technology Outlook for Yangtze River Main Line Channel Regulation*, analyzed how to coordinate the development of channel expansion and ecological environment, and proposed to establish a scientific basic framework and evaluation system for ecological channel construction. No specific technical path was given in the article. (Port and Waterway Engineering 2016 (1), pp 114-118)

(5) Dai Mingxin, in his article *Study on the Impact of Dumping of Dredged Mud on Marine Ecological Environment in* 300,000 *Ton Channel Project of Zhanjiang Port*, analyzed the impact of dumping of dredged mud on marine ecological environment. Mainly in terms of the substantial increase in the concentration of marine particulate matter and the landfill of benthic organisms by dumping activities, he analyzed the ecological environmental impact that directly led to the death of fish and other aquatic organisms and abnormal fish behavior, assessed the loss of fishery resources, and predicted the impact of fishery production. The impact assessment method formed by refinement has certain reference value for the mechanism analysis of relevant operation behaviors. (Traffic Environmental Protection 26(3), pp 9-11)

Based on the foregoing analysis, there is still a lack of a method for evaluating ecological environmental impacts and countermeasures thereof suitable for scientifically and systematically tracking and guiding the construction of ecological channel projects. With the increasing calls for marine and river ecological environment protection, it is imperative to study and implement ecological channel construction. Therefore, it is very necessary to strengthen the research on the ecological environmental impact mechanism of channel projects and the key role of countermeasures, to link up with existing conventional evaluation methods, and to develop a method for evaluating an impact and countermeasures based on mechanism analysis suitable for ecological channel construction.

SUMMARY

(1) Invention Objectives

In order to comprehensively reflect an ecological environmental impact mechanism of a channel project and a key role of countermeasures, link up with conventional evaluation methods for environmental impact assessment (EIA), environmental supervision and environmental protection acceptance investigation of construction projects, and scientifically and systematically track and guide ecological channel construction, the present invention provides a method for evaluating an ecological environmental impact of a channel project and countermeasures thereof based on mechanism analysis. The method of the present invention includes a project construction verification and change analysis method, a method for analyzing a fine classification impact mechanism and countermeasures thereof, a method for establishing a multi-level comprehensive index system of an ecological environmental impact, a method for establishing a compliance evaluation index system of an ecological channel, a method for tracking, monitoring and evaluation based on long-term time series satellite remote sensing and a method for analyzing and evaluating a superimposed and cumulative impact model, respectively. This provides an evaluation technical tool for scientific, systematic, clear and practical analysis and evaluation of ecological environmental impacts and countermeasure effects in channel project construction and operations, and for fine guidance of ecological channel construction and management and improvement of countermeasure effects and ecological channel compliance.

(2) Technical Solutions

The present invention provides a method for evaluating an ecological environmental impact of a channel project and countermeasures thereof based on mechanism analysis, including the following six analysis and evaluation methods: a project construction verification and change analysis method, a method for analyzing a fine classification impact mechanism and countermeasures thereof, a method for establishing a multi-level comprehensive index system of an ecological environmental impact, a method for establishing a compliance evaluation index system of an ecological channel, a method for tracking, monitoring and evaluation based on long-term time series satellite remote sensing and a method for analyzing and evaluating a superimposed and cumulative impact model, where their respective characteristics and correlation are as follows:

1) the project construction verification and change analysis method comprising the following steps: comparing construction details of a specific channel project after an EIA with construction and evaluation details in an EIA stage, checking construction bid sections, construction activities and implementation details according to ecological environmental impact source items and mitigation countermeasures of the specific channel project, analyzing specific changes compared with the EIA stage, identifying corresponding changes in ecological environmental impacts, and putting forward supplementary countermeasures and suggestions; the correlation is to provide a detailed and targeted project detail analysis basis for the implementation of the other five analysis and evaluation methods, as well as a basis for linking with relevant details of the EIA; at the same time, the method needs to be based on the method for analyzing a fine classification impact mechanism and countermeasures thereof to identify changes in the ecological environmental impact and propose supplementary countermeasures and suggestions in its own implementation;

2) the method for analyzing a fine classification impact mechanism and countermeasures thereof comprises respectively using 6 fine generalization models to guide mechanism analysis of impacts of revetment projects on an aquatic ecological environment, mechanism analysis of ecological environmental impacts of bottom protection, dredging and shoal cutting projects and derivation of a key role of countermeasures, mechanism analysis of ecological environmental impacts of spur dike and submerged dike projects and derivation of a key role of countermeasures, analysis of an action mechanism of ecological environmental impacts of a channel operation period and interference paths, identification of action factors of superimposed and cumulative impacts of channel projects on an ecological environment, and mechanism analysis of ecological environmental impacts of the channel projects based on ecological habits and spawning characteristics; the correlation is to provide a solid theoretical basis and a generalized model analysis tool for ecological environmental impacts of the channel projects and countermeasures thereof for the other five analysis and evaluation methods; at the same time, its own implementation needs to be based on implementation results of the project construction verification and change analysis method;

3) the method for establishing a multi-level comprehensive index system of an ecological environmental impact comprises using an index system based on mechanism analysis to systematically displays comprehensive evaluation results of ecological environmental impacts of channel projects and mitigation countermeasures thereof and to guide identification, design, monitoring, investigation, analysis and evaluation of key indexes in ecological channel construction; the index system comprises horizontal and vertical main architectures and branch architectures of the horizontal and vertical main architectures each comprise four levels with an inclusion relation, and include 4 impact process index subsystems, 15 impact type index modules, 39 groups of impact factor indexes and a plurality of single-factor classification item index indexes; the correlation is that the presentation of its own index results needs to be based on implementation results of the other five analysis and evaluation methods, and it is required to form a good interactive connection;

4) the method for establishing a compliance evaluation index system of an ecological channel comprises constructing a compliance classification item index system for an ecological channel comprising three levels, eight classification indexes and 32 item indexes contained therein to reflect connotations of safety guarantee type, ecological construction type, environmental coordination type and human-water harmony type of an ecological channel, constructing an item grading index status qualitative or quantitative evaluation criterion system and a scoring rule system in a matching way to provide a quantifiable technical criterion system and a method for conveniently evaluating a channel ecological compliance index (URECI), and constructing an ecological compliance evaluation criterion system in a matching way to evaluate the ecological compliance represented by the URECI for specific channel projects; and the correlation is that the state evaluation of its own indexes needs to be based on the implementation results of the other five analysis and evaluation methods, and it is required to form a good interactive connection;

5) the method for tracking, monitoring and evaluation based on long-term time series satellite remote sensing comprises providing a long-term time series satellite remote sensing analysis process and method to analyze and evaluate ecological environmental impacts such as erosion and deposition changes, shoreline changes and water area morphologic changes of channel projects, and performing tracking and monitoring of easily identifiable target project construction details, comparison of project impact scope consistency and project implementation effect evaluation, thereby realizing tracking of spatial-temporal changes of impacts, specifically including analysis steps of determining analysis areas, selecting remote sensing data sources, preprocessing remote sensing data, extracting water body information, evaluating impacts of different research scales, identifying channel projects, and tracking project construction and impacts; the correlation is that such analysis steps as determining analysis areas, selecting remote sensing data, identifying channel projects, and tracking project construction and impacts need to be based on the implementation results of the project construction verification and change analysis method; such analysis steps as evaluating impacts of different research scales and tracking project construction and impacts need to be based on the method for analyzing a fine classification impact mechanism and countermeasures thereof, and the implementation of this method needs to be linked with the implementation of the method for establishing a multi-level comprehensive index system of an ecological environmental impact, the method for establishing a compliance evaluation index system of an ecological channel and the method for analyzing and evaluating a superimposed and cumulative impact model to implement mutual support of relevant achievements;

6) the method for analyzing and evaluating a superimposed and cumulative impact model comprises developing, based on mechanism analysis of ecological environmental impacts of channel projects, a quantitative model of superimposed and cumulative impacts to analyze and evaluate a superimposed cumulative area and impact of suspended solids (SS) concentration exceeding a standard in water caused by construction operations, as well as the superimposed cumulative mortality and impact on benthic organisms caused by the construction operations, thus realizing the combination of qualitative and quantitative impact analysis; the correlation is that the impact analysis is based on the method for analyzing a fine classification impact mechanism and countermeasures thereof, its model calculation needs to be based on implementation results of the project construction verification and change analysis method, and its own implementation needs to be linked with the implementation of the method for establishing a multi-level comprehensive index system of an ecological environmental impact, the method for establishing a compliance evaluation index system of an ecological channel and the method for tracking, monitoring and evaluation based on long-term time series satellite remote sensing to implement mutual support of relevant achievements.

Refer to FIG. 1 for the schematic diagram of the important characteristics of the above six analysis and evaluation methods and their correlation.

The project construction verification and change analysis method includes the following specific steps:

step 1: acquiring data, mainly acquiring relevant technical documents of an EIA stage of a channel project, and more detailed technical documents related to construction details, organization and management, and construction solutions of revetment, slope protection, bottom protection, submerged dike, spur dike, dredging, and shoal cutting projects of different construction bid sections at the present stage;

step 2: according to project solutions at the current stage, analyzing and sorting out the scope, process, project details, ecological protection requirements, impact mitigation countermeasures and solutions of each bid section's revetment, slope protection, bottom protection, submerged dike, spur dike, dredging and shoal cutting channel project construction activities item by item, and comparing these with relevant details in the EIA stage item by item;

step 3: according to source items of an ecological environmental impact of a channel project, focusing on checking such source items as project quantity, geographic location and scope, construction time, construction method, construction materials, dredged soil, methods for disposal of construction waste muck and specific location for each construction activity of a water area of each construction bid section;

step 4: in view of the prevention and mitigation measures against adverse ecological environmental impacts of the channel project, focusing on checking the implementation of environmental protection optimization measures, water environment protection measures during construction and operation, ecological environmental impact mitigation measures, and ecological environment restoration and compensation measures of the project solution; and step 5: clearly displaying results of the foregoing project verification and comparative analysis of changes through lists and diagrams, summarizing and giving overall construction sequence of water areas of each construction bid section, and construction geographic location, construction details, solutions and changes in project quantities of individual projects, as well as the implementation of prevention and mitigation measures against adverse ecological environmental impacts, and analyzing and putting forward changes in ecological environmental impacts caused by project changes and supplementary countermeasures and suggestions.

The superimposed and cumulative impact quantitative model of the method for analyzing and evaluating a superimposed and cumulative impact model is shown in equations 1 and 2:

$$WFF = \Sigma WFF_i = \Sigma(AD_i \times TF(QFA_i \times YD_i \times FDF_i + BIDA_i \times QIFA_i \times YD_i \times FIDF_i)) \quad \text{equation 1;}$$

$$ASS = \Sigma ASS_i = \Sigma(DSS_i \times WSS_i \times N_i + AW_i) \quad \text{equation 2;}$$

in equation 1, WFF is a superimposed and cumulative benthic organism mortality caused by channel project operations; $WFF_i$ is a benthic organism mortality caused by an i-th operation mode; $AD_i$ is a direct injury area caused by the i-th operation mode; $QFA_i$ is a density of benthic organisms in the direct injury area caused by the i-th operation mode; TF is an annual harvest season of benthic organisms; $YD_i$ is the recovery time for a direct injury impact of the i-th operation mode; $FDF_i$ is a death percentage of benthic organisms subjected to direct injury caused by the i-th operation mode; $BIDA_i$ is a ratio of an indirect disturbance affected area to a direct injury affected area by the i-th operation mode; $QIFA_i$ is a density of benthic organisms in the indirect disturbance affected area caused by the i-th operation mode; $YID_i$ is the recovery time for an indirect injury impact of the i-th operation mode; $FIDF_i$ is a death percentage of benthic organisms affected by indirect disturbance caused by the i-th operation mode;

in equation 2, ASS is an area with superimposed and cumulative SS exceeding the standard due to channel project operations; $ASS_i$ is an area with SS exceeding the standard due to the i-th operation mode; $DSS_i$ is a longitudinal transmission distance of the area with SS exceeding the standard due to the i-th operation mode; $WSS_i$ is a transverse diffusion range of the area with SS exceeding the standard due to the i-th operation mode; $N_i$ is the number of section constructions for the i-th operation mode; and $AW_i$ is a water area occupied by the i-th operation mode.

(3) Advantages and Effects

The present invention provides a method for evaluating ecological environmental impact of channel project and countermeasures thereof based on mechanism analysis, which has the following advantages:

(1) The method for analyzing a fine classification impact mechanism and countermeasures thereof is adopted to strengthen the technical support of scientific theory for impact and countermeasure evaluation, which fills the void of research on the superimposed and cumulative impact mechanism and makes up for the deficiencies of relevant research and technical support.

(2) The project construction verification and change analysis method is adopted to achieve the connection with existing conventional EIA methods and results, and provide a more detailed and targeted project detail analysis basis for the impact and countermeasure evaluation. This fully utilizes results of the EIA work in the early stage of the project, and solves the problems that project details in the EIA stage are not detailed enough and existing project analysis methods are not targeted enough.

(3) The method for establishing a multi-level comprehensive index system of an ecological environmental impact is adopted to systematically display comprehensive evaluation results and to guide the identification, design, monitoring, investigation, analysis and evaluation of key indexes in the ecological channel construction, thus filling relevant technical gaps in the field of ecological environmental protection and impact evaluation of channel projects.

(4) The method for establishing a compliance evaluation index system of an ecological channel is adopted to reflect the scientific connotation of the ecological channel and the quantifiable technical criterion system, provide technical tool support for guiding the ecological channel construction and compliance assessment, and have a wide range of technical application space for ecological civilization construction of waterway transportation.

(5) The method for tracking, monitoring and evaluation based on long-term time series satellite remote sensing is adopted to analyze and evaluate the impacts of erosion and deposition, shoreline and water area morphology changes of the channel project, and related impacts of easily identifiable impact source items, thus providing a suitable, simple, easy and economical large-scale long-term tracking, monitoring and evaluating technical support for the effectiveness and ecological rationality evaluation of channel project design.

(6) The method for analyzing and evaluating a superimposed and cumulative impact model is adopted to analyze and evaluate the superimposed and cumulative impact of construction operations on injury of benthic organisms and SS concentration exceeding the standard. On the basis of filling up the void of superimposed and cumulative impact mechanism research, a quantitative model is further established for key impact indexes, and the analysis function of the impact model is strengthened.

In summary, according to the technical solution of the present invention, the guidance effect of research results of the ecological environmental impact mechanism of the channel project and the key role of countermeasures can be greatly strengthened, and the popularization and application of the technical solution have significant significance for the ecological civilization construction of waterway transportation.

BRIEF DESCRIPTION OF THE DRAWINGS

FIG. 1 is a schematic diagram of important characteristics of 6 analysis and evaluation methods and their correlation.

DETAILED DESCRIPTION

The present invention is described in further detail below with reference to specific examples completed according to the technical solution of the present invention.

Implementation example: Ecological environmental impact and countermeasure evaluation of Phase II Project of Deep-water Channel of Yangtze River downstream Nanjing.

(1) According to the project construction verification and change analysis method, technical data related to construction details, organization and management and construction solutions of reach revetment, slope protection, bottom protection, submerged dike, spur dike, dredging, and shoal cutting projects was acquired, and on-site research work was performed; construction details of an example project after an EIA were compared with construction and evaluation details in an EIA stage; construction bid sections, construction activities and implementation details were checked according to ecological environmental impact source items and mitigation countermeasures of the project; specific changes compared with the EIA stage were analyzed; corresponding changes in ecological environmental impacts were identified; and supplementary countermeasures and suggestions were put forward. The main verification and analysis results were as follows:

1) Item-by-item checking was performed according to the project; except for some construction bid sections, underwater damming projects (submerged dike, spur dike and bottom protection), revetment projects and dredging projects for the rest of the Yangtze River reaches were slightly reduced, and the environmental impact and ecological losses were reduced.

2) Damming and dredging projects were increased in some construction bid sections. As a construction area involves the national aquatic germplasm resource conservation zone experimental area of Chinese mitten crab and mandarin fish in the Jingjiang section of the Yangtze River, the construction impact of the projects in the corresponding sections may be correspondingly increased compared with the ecological loss and environmental impact in the area originally evaluated.

3) In some construction bid sections, the total length of energy dissipation dams was increased by 2200 m, the length of spur dikes was decreased by 675 m, and the total length of spur dikes was increased by 1525 m. The construction area involves the national aquatic germplasm resource conservation zone experimental area of Chinese mitten crab and mandarin fish in Jingjiang section of the Yangtze River. In order to reduce the ecological loss and environmental impact of the bottom protection project construction on the area, the construction period should be reasonably arranged. October to November is the migration peak period of Chinese mitten crab. The bottom protection project construction should avoid this period and be arranged as far as possible from December to January of the following year. According to the newly increased area occupied by the spur dam bottom protection project, the budget for the reconstruction and restoration of the ecological environment of fish in the protected area and its surrounding areas, as well as the budget for fish proliferation and release, are recalculated.

4) Revetment projects of 1240 m were added to some construction sections. The construction area involves Rugao national aquatic germplasm conservation zone experimental area for coilia ectenes. In order to reduce the ecological loss and environmental impact of the bottom protection project construction on the area, the construction period should be reasonably arranged. February to April is the migration peak period of coilia ectenes. Since the proliferation and release technology of the coilia ectenes is not yet fully mature, all kinds of construction should avoid the migration peak period of coilia ectenes. The bottom protection project construction should be arranged as far as possible from December to January of the following year. According to the newly increased area occupied by the spur dam bottom protection project, the budget for the reconstruction and restoration of the ecological environment of fish in the protected area and its surrounding areas, as well as the budget for fish proliferation and release, are recalculated.

5) Compared with the EIA stage, the actual construction solutions of some construction bid sections increased the total amount of dredging by 1.357 million $m^3$. Therefore, it is suggested to recalculate the budget for the reconstruction and restoration of the ecological environment of the protected areas and the surrounding fish and the budget for the proliferation and release of fish according to the increase in the dredging project quantity.

(2) According to the method for analyzing a fine classification impact mechanism and countermeasures thereof, 6 fine generalization models were adopted to respectively guide mechanism analysis of impacts of revetment projects on an aquatic ecological environment, mechanism analysis of ecological environmental impacts of bottom protection, dredging and shoal cutting projects and derivation of a key role of countermeasures, mechanism analysis of ecological environmental impacts of spur dike and submerged dike projects and derivation of a key role of countermeasures, analysis of an action mechanism of ecological environmental impacts of a channel operation period and interference paths, identification of action factors of superimposed and cumulative impacts of channel projects on an ecological environment, and mechanism analysis of ecological environmental impacts of channel projects based on ecological habits and spawning characteristics. The results were as follows:

1) The geotextile on the water of the phase II channel revetment project is usually made of permeable materials. Underwater steel wire net bag riprap also helps to reduce the barrier of the revetment to materials and energy exchange, and generally meets the material, structure and laying process requirements of the ecological revetment. The revetment has a total length of 47,435 m and an average width of 20 m, permanently occupying a water area of about 949,000 $m^2$. The habitat function of benthic organisms in this water area is lost during the construction and restoration periods. When sediment slowly fills a stone pocket, a habitat function of aquatic organisms in the revetment can be partially slowly restored.

2) The on-site monitoring of the noise impact of the Phase II channel bottom protection project shows that the underwater noise spectrum level of a soft body mattress laid in a water area close to the construction site (within a range of 10 m) can reach 105-115 dB, which disturbs fish and finless porpoise in a certain range. The implementation of the impact control countermeasures of "minimizing high-frequency knocking as far as possible" should be required in civilized construction management. The implementation of "selecting a low-noise device conforming to the acoustic environment standard as a device type" shall be required in construction bidding contracts. In order to reduce the blocking effect of bottom protection materials on the material and energy exchange between water and soil, most of dike body mattresses are woven geotextile sand rib soft body mattresses, and most of the rest of the mattresses are needle-punched composite geotextile sand rib soft body mattresses and concrete interlocking block soft body mattresses. Concrete interlocking block soft body mattresses are adopted for a small amount of dike body bottom protection and bottom protection of the rest of the mattresses, and all mattress edges are treated with heavy ballast, thus having a certain effect of reducing the material and energy exchange barrier between water and soil in aspects of materials, structure and construction technology. In order to slow down the impact on plankton, the bottom protection construction operation is scheduled to be completed from November to March of the following year during the dry season. A turbidity preventing curtain is arranged at a construction section close to a water intake to reduce the concentration of SS in water during riprap operation. In order to slow down the impact on benthic organisms, a plan of releasing benthic organisms for three consecutive years is formulated and implemented, so that the species and quantity of organisms are recovered. In order to slow down the impact on fish, research experiments are performed on the technology of ultrasonic fish drive and artificial fish nest, and ecological restoration activities for building artificial fish nest and ecological compensation activities for fish proliferation and release are performed. In order to slow down the impact on rare aquatic wild protected animals, a rescue base of nature reserve for dolphins has been built.

3) The noise from the construction of spur dikes and submerged dikes in Phase II channel causes some disturbance to endangered protected animals such as fishes and Yangtze finless porpoise. The sudden increase in suspended sediment caused by the construction adversely affects the productivity and feeding rate of zooplankton and fishes. The habitat of benthic organisms in this area is destroyed due to the occupation of local water areas by the remediation structures, which leads to the disappearance of the benthic organisms. After the structures are formed, different flow regions are formed in the vicinity. The flow velocity in the mainstream area of the remediation river reach is significantly enhanced. At the head of the dam, a flow pattern is complicated and the flow is disordered, the riverbed is in an erosion state, and the bottom sediment is unstable, which affects the survival of zoobenthic organisms, and further affects the living environment of aquatic animals and plants. For non-navigable zones of the bifurcated reach and the recirculation zones before and after the spur dike, the flow velocity is reduced and tends to ease, the habitat conditions are relatively good, and the flow velocity and water depth are appropriate. There is stable bottom sediment for zoobenthic organisms and aquatic plants to take root, and other animals such as fishes also choose to live here. In addition, a diversified reach form with alternate rapids and slow flows is built in the remediated reach, which is beneficial to increasing biodiversity and improving river ecology. The ecological protection project shall be designed, constructed and put into operation at the same time as the main projects of regulating spur dikes and submerged dikes. The ecological environment restoration and improvement solution shall be planned in advance before construction, and ecological compensation shall be carried out: benthic organisms shall be released; artificial fish nests are built, and artificial propagation and release of aquatic organisms are performed; and appropriate water areas are selected to set up artificial spawning grounds, feeding grounds and wintering grounds to compensate for the "three fields" of fish lost due to the project invasion. When the migration routes of important fishes are affected, the transitional area between spur dikes and navigation channels can be considered to reserve space for fishes to migrate through, and regular monitoring of aquatic organisms and water environment factors can be performed in and around the river reach to evaluate the effect. Ecological protection spur dikes should be reasonably selected, and design parameters should be optimized according to actual conditions, including dam height, dam length, number, jet angle, material type, structural type, dam spacing, etc. The dam body structure shall adopt materials and structural types that are near-natural and have excellent water permeability. After the new flow and sediment conditions and constraints form a dynamic balance, adverse ecological impacts are gradually restored.

4) The preliminary design dredging volume during the initial opening period of the Phase II project is 6,117,000 m$^3$, and the preliminary design dredging volume for the subsequent infrastructure construction is 7,456,000 m$^3$. Assuming an average dredging depth is 2.17 m, the dredging areas during the initial opening period and the subsequent infrastructure construction period are 2,819,000 m$^2$ and 3,436,000 m$^2$ respectively, totaling 6,260,000 m$^2$, and the preliminary design dredging volume during the subsequent dredging maintenance period is 626.1 m$^3$. Assuming an average dredging depth is 1.0 m, a dredging area is about 6,260,000 m$^2$. Due to continuous dredging during construction and operation periods, the benthic organism habitat function of 6,260,000 m$^2$ is basically lost, and the species, density and biomass of habitat organisms are lower than those in non-dredged areas. In addition, during dredging construction, the concentration of SS in the water in some local areas also increases, resulting in adverse effects on the growth of phytoplankton and fish, which will disappear with the completion of the construction.

5) The ecological environmental impact during the operation period of the Phase II project is reflected in that the mattress sinking project changes the topography and bottom sediment of the local riverbed, resulting in the loss of bottom mud and varying degrees of changes in the flow field, water quality and feed foundation of the local reach. The project partially changed the flow pattern of water on the shore and in the river and the ecological environment in the nearshore zone, affecting the drifting route of some fish eggs. At the same time, the increase in shipping volume interferes with the spawning activities of fish and also leads to an increase in the mortality rate of fish eggs and juvenile fishes, affecting the early resource situation in the basin. Due to little change in hydrological situation, fish spawning and early resources gradually recover. A shoal (bottom) protection zone reduces the area of the shallow water area in the transition section of the river, and meiobenthic organisms that like flowing water and pebble and gravel bottom sediment lose some suitable habitats and spawning grounds accordingly, resulting in changes in the biological composition of local reaches and even in the structure of regional ecosystems. The Yangtze finless porpoise is extremely sensitive to sounds in the range of 45-139 kHz. When large cargo ships sail, even if the distance is 200 m, their impact on the finless porpoise is obvious. When speedboats sail at a distance of 200 m or large empty cargo ships sail at a distance of 40 m, they have an impact on finless porpoise. If the distance between the sailing ship and the finless porpoise is closer, the impact of ship noise on the finless porpoise is more obvious. After the completion of the Phase II project, the navigable seagoing vessel increases from 30,000 tons to 50,000 tons. As the noise source of an engine increases compared with that before the project, the adverse impact of shipping noise on the finless porpoise obviously increases, and it is imperative to strengthen the protection of the finless porpoise along the river channel. Sudden pollution accidents mainly include leakage of fuel oil and raw materials caused by ship accidents, causing pollution damage to aquatic organisms. Fuel oil leakage causes the finless porpoise distributed in the lower reaches of the Yangtze River to have difficulty breathing, and oil stains adhere to the skin, resulting in difficulty in breathing. Leakage of raw materials leads to changes in water quality in the lower reaches of the Yangtze River, which may lead to life-threatening situations such as acute poisoning of fish and finless porpoise. With the improvement of navigation conditions, the flow of ships increases and the shipping density increases. The discharge of various pollutants and the probability of collision accidents during the operation of ships increase. If the prevention is missing or improper, it causes water, air, sound and solid waste pollution of ships, as well as oil spills from ships and leakage of raw materials, resulting in changes in water quality, poisoning of aquatic organisms and even life threatening, thus causing adverse effects on people's health and aquatic organisms and further affecting the aquatic food chain. In addition, the ecological environmental impact of maintenance dredging cannot be ignored.

6) According to the foregoing analysis of the interference ways and action mechanisms of impacts of revetment, bottom protection, spur dikes, shallow dikes, dredging and shoal cutting during the construction period and shipping operations during the operation period on aquatic ecology, the whole reach of the Phase II channel may have superimposed and cumulative impacts in aspects of habitat occupation and habitat fragmentation, emission of suspended particles and noise pollutants, interference of construction and operations on protected species, and the like. The spawning grounds are used as places for fish to complete the reproduction process. It is the most important and sensitive habitat for fish. Oviposition fishes are mainly divided into two types: fishes producing drifting eggs and fishes producing adhesive/demersal eggs. The fishes producing drifting eggs have high requirements on the water depth, water temperature, flow velocity and flow pattern of the river channel. They mainly appear in the sections where the riverbed changes rapidly (such as near rock projecting over water). Changes in hydrodynamic conditions to a certain extent (such as vesicle-vortex fluid) can stimulate ovulation of fish. The representative fishes in the water areas of the Phase II project are the four major fishes of the Yangtze River (black carp, grass carp, silver carp and bighead carp), myxocyprinus asiaticus, leiocassis longirostris and coilia ectenes. The fishes producing adhesive/demersal eggs mainly appear in river reaches where the flow pattern is relatively mild or even still and aquatic plants are abundant. As the specific gravity of fish eggs is greater than that of water, the fish eggs often need to be hatched by being attached to the surface of aquatic plants or boulders and silt. The representative fishes in the water areas of the Phase II project are carp, crucian, takifugu obscures, yellow catfish, erythroculter ilishaeformis, xenocypris microlepis, Chinese mitten crab and bream.

In order to prevent and mitigate the superimposed and cumulative adverse impacts of channel projects on these fishes, according to the living environment and habits of representative fishes as shown in Table 1, countermeasures for preventing and mitigating adverse impacts should be planned and implemented in a targeted manner

TABLE 1

| Species | Living environment and habits of fishes |
|---|---|
| Black carp | It is inhabited in the middle and lower layers of water areas. It mainly feeds on zoobenthic organisms such as snails, mussels and small freshwater mussels. |
| Grass carp | It is inhabited in the middle and lower layers of water areas and shores with plenty of aquatic plants. It mainly feeds on aquatic plants, reeds, etc. |
| Silver carp | It is inhabited in the lower layer of a water area. It feeds on phytoplankton such as diatoms and green algae. |
| Bighead carp | It is inhabited in the upper and middle layers of water areas. It feeds on zooplankton such as water fleas. |
| Carp | Benthic omnivorous fish It feeds on both animals and plants. It has a wide feed range and developed rostral bone, and often feeds on mud. |
| Crucian | It is a bottom fish, swimming, foraging, perching underwater. It mainly feeds on plant feed. |
| *Takifugu obscurus* | It is migratory, is inhabited in the middle and lower layers of water areas, and migrates to the Yangtze River in groups to spawn and breed in March each year. Juvenile fish live in rivers or lakes through to the rivers to fatten, and return to the sea in spring of the following year. It is omnivorous, preferably carnivorous. |
| *Myxocyprinus asiaticus* | It likes to move in the middle and bottom of the water body. Every year in mid-February, parent fishes with nearly mature gonads go upstream and breed in rapids from March to May. It has frequent food intake, belonging to omnivorous animals. |
| *Leiocassis longirostris* | It is a bottom fish, swimming, foraging, perching underwater. It is carnivorous and likes to hunt at night. |
| Yellow catfish | It lives in still water or shallows with slow flow and hides by day and comes out by night, and the male fish have nesting habits during the reproductive period. Carnivorous-oriented omnivorous fish |
| *Erythroculter ilishaeformis* | Large freshwater economic fish in the middle and upper layers of waters Fierce carnivorous fish |
| *Xenocypris microlepis* | It is inhabited in the lower and middle layers of the water body. The fish adapt to flowing water life and are sexually active. In winter, they inhabit deep water with open water surface. After it is warm in spring, they disperse for activities and forages. In spawning season, they have a certain short-distance migration phenomenon and go back to the spawning grounds with suitable conditions to spawn in clusters. It belongs to omnivorous fish and mainly feeds on algae such as underwater humus, diatoms, filamentous algae and debris of higher plants. |
| Chinese mitten crab | It lives in caves in mud banks of rivers, rivers and lakes. It hides in the daytime and emerges at night. The Chinese mitten crab swims back offshore to breed. The eggs carried by the parent body hatch between March and May of the following year. The larvae undergo many metamorphoses and develop into young crabs. They then swim up rivers and continue to grow in fresh water. It feeds on animal carcasses or grain. |
| *Coilia ectenes* | It is a small migratory fish living upper and middle layers of warm water, and usually lives in the sea. The *coilia ectenes* enters the river from the sea in February to March every year, and migrates procreatively up the river. After spawning, parent fishes disperse in fresh water to feed, and slowly return to the estuary and offshore in succession to continue fattening. It feeds on copepods, cladocera, rotifers and small fish, etc. |
| Bream | It inhabits the middle and lower layers of the open water area with silt sediment and submerged plants, which is more suitable for quiet water life. It mainly feeds on plant feed. |

(3) According to the method for establishing a multi-level comprehensive index system of an ecological environmental impact, an index system based on mechanism analysis systematically displays comprehensive evaluation results of ecological environmental impacts of channel projects and mitigation countermeasures thereof and is used to guide identification, design, monitoring, investigation, analysis and evaluation of key indexes in ecological channel construction; horizontal and vertical main architectures and branch architectures of the architecture are each composed of four levels with an inclusion relation, and include 4 impact process index subsystems, 15 impact type index modules, 39 groups of impact factor indexes and a plurality of single-factor classification item index indexes. See Table 2 for details.

TABLE 2

List of multi-level comprehensive index system for an ecological environmental impact of a channel project

| Impact process subsystem (A) | Impact type indicator module (B) | Influencing factor index (C) | Single-factor classification item index (D) |
|---|---|---|---|
| Operation behavior system (A1) | Construction operation module (B1-1) | Operation time sequence (C1-1-1) | Overall construction operation time sequence schedule of different construction sections (D1-1-1-1) Operation time sequence of dredging, shoal cutting, damming, bottom protection and revetment in different construction sections (D1-1-1-2) |
| | | Operation form (C1-1-2) | Material, structure and form of hydraulic structures for dredging, shoal cutting, bottom protection and revetment construction at different construction sections operation position and design parameters such as water flow and water depth (D1-1-2-1) Design parameters (D1-1-2-2) such as dam height, length, quantity, jet angle, material type, structural type, dam spacing, whether to include near-natural materials with excellent water permeability and structural type for spur dike and submerged dike construction in different construction sections |
| | | Operation mode (C1-1-3) | Method for laying different types of soft body mattresses for bottom protection construction in different construction sections (D1-1-3-1) Operation modes in each construction operation type of different construction sections that avoid a fish spawning period, a migration period and protect the protected animal Yangtze finless porpoise in a breeding period and a nursery period (D1-1-3-2) Construction organization modes in each construction operation type of different construction sections that avoid centralized operation in the same time period (D1-1-3-3) Indexes such as dredging and shoal cutting excavation, transportation, hydraulic reclamation and mud dumping technologies in different construction sections (D1-1-3-4) |
| | | Operation intensity (C1-1-4) | Indexes such as operation length, width, volume, occupation position of water and land areas, area and construction period of relevant construction operation types in different construction sections (D1-1-4-1) |
| | Project change and environmental protection measures implementation module (B1-2) | Changes in construction operations (C1-2-1) | Changes in construction operation time sequence, scope, project quantity, materials, structure and construction methods of dredging, shoal cutting, damming, revetment and bottom protection and other projects during the EIA period and the actual construction period (D1-2-1-1) |
| | | Changes in environmental protection measures (C1-2-2) | Changes in environmental protection measures during the EIA period and the actual construction period (D1-2-2-1) and implementation status of environmental protection measures (D1-2-2-2) |
| | Channel operation and maintenance module (B1-3) | Navigation operation (C1-3-1) | Changes in tonnage and quantity of navigable ships, ship type and fuel, cargo type and volume (D1-3-1-1), coastal port throughput and cargo type changes (D1-3-1-2), ship and port water, air, sound and solid waste emissions (D1-3-1-3), ship and port pollution prevention countermeasures (D1-3-1-4) |
| | | Channel maintenance (C1-3-2) | Scope, frequency, dredging volume of channel maintenance dredging (D1-3-2-1) and pollution prevention and control countermeasures (D1-3-2-2) |
| | Sudden pollution accident and emergency module (B1-4) | Leakage type (C1-4-1) | Oil spill (crude oil, heavy oil, diesel oil) (D1-4-1-1), hazardous chemicals (D1-4-1-2) |
| | | Leakage scale (C1-4-2) | Easy overflow (D1-4-2-1) and leakage duration (D1-4-2-2) |

TABLE 2-continued

List of multi-level comprehensive index system for an ecological environmental impact of a channel project

| Impact process subsystem (A) | Impact type indicator module (B) | Influencing factor index (C) | Single-factor classification item index (D) |
|---|---|---|---|
| | | Probability of pollution risk (C1-4-3) | Risk probability of oil spill and chemical leakage accidents of ships and coast of the channel (D1-4-3-1), Susceptible location (D1-4-3-2), statistical probability of classified wind direction and wind speed (D1-4-3-3) |
| | | Emergency preparedness (C1-4-4) | Emergency countermeasures and staffing (D1-4-4-1), distribution of environmentally sensitive resources (D1-4-4-2), emergency plan (D1-4-4-3), pollution early warning model (D1-4-4-4), damage compensation and repair countermeasures (D1-4-4-5) |
| Habitat change system (A2) | Hydrological environment module (B2-1) | Topographical change (C2-1-1) | Changes in shoreline and water depth distribution in different construction sections (D2-1-1-1) |
| | | Water flow change (C2-1-2) | Changes in monthly or seasonal water flow, flow direction and velocity distribution in different construction sections (D2-1-2-1) |
| | | Illumination change (C2-1-3) | Changes in monthly or seasonal illumination condition distribution in different construction sections (D2-1-3-1) |
| | Water ecological environment (B2-2) | Water quality (C2-2-1) | Temporal-spatial distribution of pH (dimensionless) (D2-2-1-1), water temperature (° C.)(D2-2-1-2), suspended solids (SS)(D2-2-1-3), dissolved oxygen (D2-2-1-4), permanganate index ($COD_{Mn}$)(D2-2-1-5), five-day biochemical oxygen demand ($BOD_5$)(D2-2-1-6), total phosphorus (D2-2-1-7), ammonia nitrogen (D2-2-1-8), total nitrogen (D2-2-1-9), volatile phenol (D2-2-1-10), petroleum (D2-2-1-11), eutrophication index (D2-2-1-12), arsenic (D2-2-1-13) and sulfide (D2-2-1-14) |
| | | Shoal and sediment types (C2-2-2) | Particle size distribution of different construction sections (D2-2-2-1) and habitat types (D2-2-2-2) |
| | | Shoal and sediment weight (C2-2-3) | Temporal-spatial distribution of petroleum (D2-2-3-1), organic carbon (D2-2-3-2), pH value (D2-2-3-3), cadmium (D2-2-3-4), mercury (D2-2-3-5), arsenic (D2-2-3-6), copper (D2-2-3-7), lead (D2-2-3-8), chromium (D2-2-3-9), zinc (D2-2-3-10) and nickel (D2-2-3-11) |
| | Changes in social and economic environment (B2-3) | Fisheries (C2-3-1) | Temporal-spatial distribution of fishery resources (D2-3-1-1) and catch (D2-3-1-2) |
| | | Water conservancy (C2-3-2) | Temporal-spatial distribution of annual runoff (D2-3-2-1) and sediment flux (D2-3-2-2) |
| | | Environment (C2-3-3) | Temporal-spatial distribution of inflow pollutant flux (D2-3-3-1) |
| | | Traffic (C2-3-4) | Corresponding changes caused by navigation environment changes in different construction sections (D2-3-4-1) |
| Species activity system (A3) | Various aquatic plant and animal activity modules (B3-1) | Coenology (C3-1-1) | Temporal-spatial distribution of chlorophyll a content (D3-1-1-1)<br>Phytoplankton (species composition, quantitative distribution, dominant species and species diversity, abundance) (D3-1-1-2)<br>Zooplankton (species composition, quantitative distribution, dominant species and species diversity, abundance) (D3-1-1-3)<br>benthic organisms (species composition, quantitative distribution, dominant species and species diversity, abundance) (D3-1-1-4)<br>Intertidal benthic organisms (species composition, quantitative distribution, dominant species and species diversity, abundance) (D3-1-1-5)<br>Aquatic plants and aquatic vascular plants (species composition, quantitative distribution, dominant species and species diversity, abundance) (D3-1-1-6)<br>Species composition, dominant species, resource density and distribution of fish eggs and larva fishes (D3-1-1-7)<br>Species composition, dominant species, resource density and distribution of necton (D3-1-1-8)<br>Overview of "three fields" of important fishes in project water areas: changes in indexes such as habitat, migratory passage, wintering field, spawning field, feeding field and nursery field distribution (D3-1-1-9) |

TABLE 2-continued

List of multi-level comprehensive index system for an ecological environmental impact of a channel project

| Impact process subsystem (A) | Impact type indicator module (B) | Influencing factor index (C) | Single-factor classification item index (D) |
|---|---|---|---|
| | | | Current situation of fishery production in water areas near the project (D3-1-1-10) |
| | | | Status of rare aquatic protected animals (D3-1-1-11) |
| | | Productivity (C3-1-2) | Temporal-spatial distribution of primary productivity (D3-1-2-1) |
| | | | Temporal-spatial distribution of secondary productivity (D3-1-2-2) |
| | | Biomass weight (C3-1-3) | Temporal-spatial distribution of petroleum Hydrocarbons (D3-1-3-1), copper (D3-1-3-2), zinc (D3-1-3-3), lead (D3-1-3-4), chromium (D3-1-3-5) and mercury (D3-1-3-6) |
| | | Ecotoxicology (C3-1-4) | Temporal-spatial distribution of biological residues (PCB)(D3-1-4-1) |
| | Ecosystem function (B3-2) | Ecological service functions (C3-2-1) | Supply of suitable habitats such as shallow water and slow-flowing shoals (D3-2-1-1) |
| | | | Supply of suitable habitats such as diverse flow patterns (D3-2-1-2) |
| | | | Supply of suitable habitats such as emerged plants (D3-2-1-3) |
| | | | Supply of suitable habitats having water permeability and the like (D3-2-1-4) |
| | | Ecological landscape health (C3-2-2) | Changes in water self-purification capacity (D3-2-2-1) |
| | | | Diversity and area change of suitable habitats (D3-2-2-2) |
| | | | Habitat fragmentation change (D3-2-2-3) |
| | Human intervention (B3-3) | Mitigation measures (C3-3-1) | Implementation of water quality protection (D3-3-1-1) |
| | | | Protection of aquatic organisms (D3-3-1-2) |
| | | | Rescue of aquatic organisms (D3-3-1-3) |
| | | | Implementation effects of ecological restorations such as proliferation and release, artificial fish nest and plant community construction (D3-3-1-4) |
| | Key activities of important organisms (B3-4) | Species activity (C3-4-1) | Ecological habits such as perching, foraging, feeding, reproduction, spawning and migration of main protected species and economic fishes (D3-4-1-1) |
| | | Correlation of activity changes (C3-4-2) | Activity change correlation indexes such as important biological community index, habitat area, habitat fragmentation, and changes in food sources and water sources (D3-4-2-1) |
| Ecological impact system (A4) | Itemized impact (B4-1) | Direct impact of itemized operation (C4-1-1) | Direct impact indexes of itemized construction operations such as dredging, shoal cutting, damming, bottom protection and revetment (D4-1-1-1) and channel operation and maintenance (D4-1-1-2) on an ecological environment |
| | | Indirect impact of itemized operation (C4-1-2) | Indirect impact indexes of itemized construction operations (D4-1-2-1) and channel operation and maintenance (D4-1-2-2) on an ecological environment |
| | Superimposed and cumulative impacts (B4-2) | Superimposed impact of multiple projects (C4-2-1) | Superimposed impact indexes (D4-2-1-1) brought by different types of construction operations and channel operation and maintenance on the same direct impact factors (such as noise in water, concentration of SS in water, flow direction and velocity, habitat change, and loss of shoal and benthic organisms) within the same or similar time and space range |
| | | Cumulative impact of multiple projects (C4-2-2) | Comprehensive cumulative impact index (D4-2-2-1) generated after superposition of various direct and indirect impacts in projects and affected areas |
| | Impact of implementation effect of environmental protection measures (B4-3) | Measures proposed in the EIA stage (C4-3-1) | In the EIA stage of the project, the implementation and effect of corresponding environmental protection measures proposed for dredging, shoal cutting, damming, bottom protection, revetment and other construction operations as well as channel operation and maintenance (D4-3-1-1), and emergency measures corresponding to oil spill and chemical leakage (D4-3-1-2) |
| | | Additional measures for project changes (C4-3-2) | Status of additional measures corresponding to impacts caused by project changes (D4-3-2-1) |

TABLE 2-continued

List of multi-level comprehensive index system for an ecological environmental impact of a channel project

| Impact process subsystem (A) | Impact type indicator module (B) | Influencing factor index (C) | Single-factor classification item index (D) |
|---|---|---|---|
| | Duration of impacts (B4-4) | Short-term impact (C4-4-1) | Indexes of short-term adverse impacts caused by project construction and maintenance (D4-4-1-1) and seasonal operation (D4-4-1-2), which can be eliminated or significantly slowed down in the short term with the completion of construction and maintenance or seasonal changes, such as the concentration of SS in water and the increase of noise in water caused by riprap and embankment construction, and the indexes of impacts of project construction on key activities such as migration, spawning and overwintering of aquatic organisms |
| | | Medium and long-term impact (C4-4-2) | Indexes of adverse impacts of project construction and maintenance, which are still difficult to be significantly slowed down in the short term even after the completion of construction and maintenance (D4-4-2-1), such as blocking effects of water flow changes caused by riprap and embankment construction on material and energy exchange, where the adverse effects of project operation are still difficult to be significantly slowed down even though seasonal changes (D4-4-2-2), such as impacts of project operation on migration, spawning and overwintering of aquatic organisms |

(4) According to the method for establishing a compliance evaluation index system of an ecological channel, a compliance classification item index system for an ecological channel consisting of three levels, eight classification indexes and 32 item indexes contained therein is used to reflect connotations of safety guarantee type, ecological construction type, environmental coordination type and human-water harmony type of an ecological channel, an item grading index status qualitative or quantitative evaluation criterion system and a scoring rule system are constructed in a matching way to provide a quantifiable technical criterion system (see Table 3 for details) and a method for conveniently evaluating a channel ecological compliance index (URECI), and an ecological compliance evaluation criterion is also constructed in a matching way to evaluate the ecological compliance represented by the URECI for case projects. The evaluation result is that the ecological compliance is excellent.

TABLE 3

List of qualitative or quantitative scoring criterion system for 32 indexes and 5 grade states

| | Score | | | | |
|---|---|---|---|---|---|
| Index | 4 | 3 | 2 | 1 | 0 |
| Navigation span C11 | It ensures that two 100,000-ton ships pass side by side. | | It ensures that two 10,000-ton ships pass side by side. | | A 10,000-ton ship cannot pass. |
| Navigation guarantee rate C12 | It ensures that two 100,000-ton ships pass side by side. | | It ensures that two 10,000-ton ships pass side by side. | | A 10,000-ton ship cannot pass. |
| Improvement rate of navigation aids facilities C13 | Navigation signs, signal signs and special signs are complete. | | | | There is no sign or no obvious sign. |
| Visual satisfaction C14 | The field of vision is spacious, bright and unobstructed. | | | | The field of vision is not good. |
| Coastal zone width C21 | > double the river width | >0.5-1 time | >0.25-0.5 time | >0.1-0.25 time | ≤0.1 time |
| Coastal zone slope C22 | 0-10° | 10°-30° | 30°-60° | 60°-90° | 90° |
| Revetment type C23 | Natural prototype | Artificial near-natural type | Riprap, low earth slope retaining wall, concrete grid vegetation | Stone heaps, wet masonry stones, dry masonry stones | Concrete |

TABLE 3-continued

List of qualitative or quantitative scoring criterion system for 32 indexes and 5 grade states

| Index | Score | | | | |
|---|---|---|---|---|---|
| | 4 | 3 | 2 | 1 | 0 |
| Longitudinal linkage C24 | The coastal zone is smooth. | A small number of obstacles | Interrupt 1-2 times | Interrupt 3-5 Times | Interrupt more than 5 times |
| Transverse connectivity C25 | Permeable interface >80% | 60%-80% | 40%-60% | 20%-40% | <20% |
| Species richness C31 | More than 40 | 30-40 | 20-30 | 10-20 | Less than 10 |
| Ecological structure grass seeds C32 | Tree-shrub and tree-grass (cany bamboo) | Tree-shrub or tree-grass | Tree-grass | There is only one. | No vegetation |
| Vegetation continuity C33 | Continuous uniform distribution | Semicontinuous distribution | Block distribution | Scattered distribution | No vegetation distribution |
| Vegetation coverage C34 | >75% | 50%-75% | 25%-50% | 5%-25% | ≤5% |
| Species number renewal rate C35 | Species number >75% | 50%-75% | 25%-50% | 5%-25% | ≤5% |
| Substrate type C41 | Clean soil interface, accompanied by sandstone and gravel | Soil interface, no silt deposition and artificial coverage | Soil interface, with a small amount of silt deposition and permeable artificial coverage | Black thick silt and more permeable artificial coverage | Concrete pouring and impermeable artificial coverage |
| Topographic complexity C42 | Concave-convex undulate porous structure | — | Locally there is topographic relief. | — | The terrain is flat and hard. |
| Hydrodynamic condition C43 | Water flow is naturally smooth. | The flow rate is reasonable. | The flow rate is controlled by a pump brake. | The flow rate is too fast or too slow. | It is completely dead water. |
| Water transparency C44 | >2 m | 1-2 m | 0.5-1 m | 0.2-0.5 m | <0.2 m |
| Aquatic plant type C51 | Emerged plant, submerged plants and floating plant appear. | Emerged plant and submerged plants | Emerged plants and floating plants or submerged plants and floating plants | There is only one. | No aquatic plant distribution |
| Number of species of benthic animals C52 | More than 20 | 10-20 | 5-10 | 1-5 | No aquatic plant |
| Status of benthic animals C53 | The biomass and richness are high, and there are clean index species. | The biomass and richness are higher. | Pollution-resistant species appear with medium biomass. | There are only a small amount of pollution-resistant species and the biomass is very low. | There are no benthonic animals. |
| Fish species C54 | Carnivorous fishes, herbivorous fishes and filtering-feeding fishes all appear. | Carnivorous fishes and herbivorous fishes | Carnivorous fishes and filtering-feeding fishes | Only filtering-feeding fishes | No fish |
| Easy hydrophilicity C61 | Completely open along the line | — | Open at a specific location | — | Completely closed |
| Water surface cleanliness C62 | There are no sundries on the water surface. | A small number of plants float. | A small amount of garbage is occasionally seen. | Garbage often floats. | The water is very dirty. |

TABLE 3-continued

List of qualitative or quantitative scoring criterion system for 32 indexes and 5 grade states

| Index | Score 4 | Score 3 | Score 2 | Score 1 | Score 0 |
|---|---|---|---|---|---|
| Coastal zone landscape C63 | The seasonal aspects are distinct and the layout is well-arranged. | The space configuration is beautiful, but there is no seasonal change. | The seasonal changes are distinct, but the space allocation is insufficient. | Spatial-temporal changes of landscape are relatively monotonous. | There are no spatial-temporal changes and the landscape is monotonous and stiff. |
| Infrastructure improvement rate C71 | The infrastructure is sound and undamaged. | | The infrastructure is slightly damaged. | | The infrastructure does not match. |
| Energy cleanliness C72 | Promotion of photosynthesis | Solar energy and wind energy | Hybrid energy is used. | Electric energy, with less power consumption | A lot of electric energy is used. |
| Management system C73 | The management system has the function of layer-upon-layer restriction and supervision and regular assessment and training. | | | | No management system |
| Maintenance difficulty C74 | Occasionally a small amount of manual maintenance is performed, and the cost is very low. | A small amount of manual input is required on a regular basis. | More manual input is required on a regular basis. | A large amount of manual input is required for a long time. | Unattended for a long term, overgrown with weeds |
| Comprehensive pollution index of fleet C75 | The comprehensive pollution level of fleet noise, water and air is very low. | The comprehensive pollution level of fleet noise, water and air is low. | The comprehensive pollution level of fleet noise, water and air is relatively low. | The comprehensive pollution level of fleet noise, water and air is medium. | The comprehensive pollution level of fleet noise, water and air is high. |
| Service area distribution rate C76 | Spacing <10 km | Spacing 10-20 km | Spacing 20-30 km | Spacing 30-40 km | Spacing >40 km |
| Service area perfectness rate C77 | There are various types of services provided in the service area. | | The service area provides a single service. | | No service area |

(5) According to the method for tracking, monitoring and evaluation based on long-term time series satellite remote sensing, ecological environmental impacts such as erosion and deposition changes, shoreline changes and water area morphologic changes of channel projects are analyzed and evaluated, and tracking and monitoring of easily identifiable target project construction details, comparison of project impact scope consistency and project implementation effect evaluation are performed. The details are as follows:

1) Remote sensing image data sources were selected: Four kinds of optical satellite remote sensing data were mainly used, namely MSS, TM, ETM and OLI_TRIS data of Landsat series of the United States. This case study acquired and processed remote sensing image data of a reach of a phase II project for more than 40 years from the mid-1970s to the recent period (2015-2017). The data was collected in six stages, namely, the mid-1970s, early 1980s, early 1990s, 2000, around 2010, and the construction period of the project from 2015 to 2017. The data of the same period of the year (dry season) was selected, as shown in Table 4.

TABLE 4

Remote sensing image data source of a reach of the case project

| Sequence number | Image shooting time | Optical sensor type | Number of images | Spatial resolution (m) |
|---|---|---|---|---|
| 1 | Mid-1970s | MSS | 3 | 78 |
| 2 | Early 1980s | MSS | 6 | 80 |
| 3 | Early 1990s | TM | 4 | 30 |
| 4 | 2000 | ETM | 6 | 30/15 |
| 5 | 2010 | TM | 4 | 30 |
| 6 | 2015 to 2017 | OLI | 6 | 30/15 |

2) The evaluation results show that during the 35 years from 1981 to 2015, the channel water area of the reach of the Phase II project of the Yangtze River decreased by 82.02 $km^2$, where the water area decreased by 26.93 $km^2$ from 1981 to 2000, with an average annual decrease of 1.42 $km^2$, and the water area decreased by 55.09 $km^2$ from 2000 to 2015, with an average annual decrease of 3.67 $km^2$. The water area morphological changes of the Hechangzhou reach and the Fujiangsha reach were the most significant, mainly dominated by deposition, while the rest of reaches were not changed much in 35 years and remained basically stable.

3) According to remote sensing monitoring, as of Apr. 22, 2016, the 3150-meter submerged dike at the head of Shuangjiansha, the revetments on both sides, and the spur dikes on the north and south sides of Shuangjiansha were basically completed. Satellite remote sensing monitoring realizes the tracking and monitoring of the whole process of channel regulation project construction in the Fujiangsha reach. Monitoring results show that the project impact scope conforms to the prediction scope of environmental impact evaluation. The construction of the project has good practical effects on the shoreline stability, the balance between erosion and deposition and the stability of water body morphology.

(6) According to the method for analyzing and evaluating a superimposed and cumulative impact model, a superimposed cumulative area and impact of SS concentration exceeding the standard in water caused by construction operations as well as the superimposed cumulative mortality and impacts on benthic organisms caused by the construction operations are analyzed and evaluated. The specific analysis results of the calculation of the superimposed cumulative area of SS concentration exceeding the standard in water and its impact are as follows:

1) According to simulation results of the water flow and sediment model, when the sediment source intensity of riprap operation reaches 6 kg/m$^3$ and it is discharged continuously for 36 hours, the concentration increment of SS exceeds 10 mg/L within 800 m downstream during spring tide. If the transverse diffusion range is 125 m, the area of pollution exceeding the standard is about 100,000 m$^2$. The impact range of dredging operations on the downstream exceeding the standard reaches about 2,000 m. If the transverse diffusion range is 200 m, the area of pollution exceeding the standard is about 400,000 m$^2$.

2) In order to calculate the superimposed and cumulative impacts of the impact range of SS exceeding the standard in channel project construction, according to the method for analyzing and evaluating a superimposed and cumulative impact model, a relevant superposition and accumulation formula of the case project is studied and established, specifically as follows: $ASS=\Sigma ASSi=\Sigma(DSSi \times WSSi \times Ni + AWi)$, where ASS is an area with superimposed SS exceeding the standard due to channel project operations; $ASS_i$ is an area with SS exceeding the standard due to the i-th operation mode; $DSS_i$ is a longitudinal transmission distance of the area with SS exceeding the standard due to the i-th operation mode (the distance is 2000 m for dredging operation, and 800 m for other construction operations); $WSS_i$ is a transverse diffusion range of the area with SS exceeding the standard due to the i-th operation mode (the range is 200 m for dredging operation, and 125 m for other construction operations); $N_i$ is the number of section constructions for the i-th operation mode (the number of section constructions of the dredging, spur dike and bottom protection laying, and revetment projects of the Phase II project are 21, 14 and 16 respectively); and $AW_i$ is a water area occupied by the i-th operation mode (the water areas for the dredging, spur dike and bottom protection laying, and revetment projects of the Phase II project are 6,260,000 m$^2$, 117,000 m$^2$ and 949,000 m$^2$ respectively).

3) Assuming that the concentration of SS in various construction operation regions of the Phase II project exceeds the standard, and considering that the transmission and diffusion impact range corresponding to the area exceeding the standard in each operation area should be added to the area of pollution exceeding the standard that is simulated by the foregoing model, then according to the superposition and accumulation formula of the foregoing impact range of the SS concentration exceeding the standard for channel project construction, the areas with the SS concentration exceeding the standard for dredging and other construction operations of the Phase II project are calculated to be 14,660,000 m$^2$ and 4,066,000 m$^2$ respectively, and the area of the superimposed impact with the SS concentration exceeding the standard is 18,726,000 m$^2$. The growth of phytoplankton and fish in these areas is adversely affected to a certain extent during the corresponding construction period.

What is claimed is:

1. A method for evaluating an ecological environmental impact of a channel project and countermeasures thereof based on mechanism analysis, comprising six analysis and evaluation methods, which are a project construction verification and change analysis method, a method for analyzing a fine classification impact mechanism and countermeasures thereof, a method for establishing a multi-level comprehensive index system of an ecological environmental impact, a method for establishing a compliance evaluation index system of an ecological channel, a method for tracking, monitoring and evaluation based on long-term time series satellite remote sensing and a method for analyzing and evaluating a superimposed and cumulative impact model, respectively, wherein a correlation between the six analysis and evaluation methods is as follows:

1.1 the project construction verification and change analysis method provides a detailed engineering basis for an implementation of the other five analysis and evaluation methods;

1.2 the method for analyzing a fine classification impact mechanism and countermeasures thereof provides a solid theoretical basis for an implementation of the other five analysis and evaluation methods;

1.3 the method for establishing a multi-level comprehensive index system of an ecological environmental impact is used to systematically display evaluation results of the other five analysis and evaluation methods;

1.4 the method for establishing a compliance evaluation index system of an ecological channel is used to provide an evaluation criterion system so as to evaluate an ecological channel compliance degree of actual channel projects according to implementation results of the other five analysis and evaluation methods;

1.5 the method for tracking, monitoring and evaluation based on long-term time series satellite remote sensing is connected with implementation results of the other five analysis and evaluation methods, so as to realize spatio-temporal change tracking of relevant impacts; and 1.6 the method for analyzing and evaluating a superimposed and cumulative impact model is connected with implementation results of the other five analysis and evaluation methods, so as to realize qualitative and quantitative combination of relevant impact evaluation;

wherein specific characteristics of each of the six analysis and evaluation methods are as follows:

2.1 the project construction verification and change analysis method comprises the following steps: comparing construction details of a specific channel project after an environmental impact assessment (EIA) with construction and evaluation details in an EIA stage, checking construction bid sections, construction activities and implementation details according to EIA source items and mitigation countermeasures of the specific channel project, analyzing specific changes compared with the EIA stage, identifying corresponding changes in ecological environmental impacts, and putting forward supplementary countermeasures and suggestions;

2.2 the method for analyzing a fine classification impact mechanism and countermeasures thereof comprises respectively using six fine generalization models to guide mechanism analysis of impacts of revetment projects on an aquatic ecological environment, mechanism analysis of ecological environmental impacts of bottom protection, dredging and shoal cutting projects and derivation of a key role of countermeasures, mechanism analysis of ecological environmental impacts of spur dike and submerged dike projects and derivation of a key role of countermeasures, analysis of an action mechanism of ecological environmental impacts of a channel operation period and interference paths, identification of action factors of superimposed and cumulative impacts of channel projects on an ecological environment, and mechanism analysis of ecological environmental impacts of the channel projects based on ecological habits and spawning characteristics;

2.3 the method for establishing a multi-level comprehensive index system of ecological environmental impacts comprises using an index system based on mechanism analysis to systematically displays comprehensive evaluation results of ecological environmental impacts of channel projects and mitigation countermeasures thereof and to guide identification, design, monitoring, investigation, analysis and evaluation of key indexes in ecological channel construction, wherein the index system comprises horizontal and vertical main architectures and branch architectures of the horizontal and vertical main architectures each comprise four levels with an inclusion relation and comprise 4 impact process index subsystems, 15 impact type index modules, 39 groups of impact factor indexes and a plurality of single-factor classification item index indexes;

2.4 the method for establishing a compliance evaluation index system of an ecological channel comprises constructing a compliance classification item index system for an ecological channel comprising three levels, eight classification indexes and 32 item indexes contained therein to reflect connotations of safety guarantee type, ecological construction type, environmental coordination type and human-water harmony type of an ecological channel, constructing an item grading index status qualitative or quantitative evaluation criterion system and a scoring rule system in a matching way to provide a quantifiable technical criterion system and a method for conveniently evaluating a channel ecological compliance index (URECI), and constructing an ecological compliance evaluation criterion system in a matching way to evaluate the ecological compliance represented by the URECI for specific channel projects;

2.5 the method for tracking, monitoring and evaluation based on long-term time series satellite remote sensing comprises providing a long-term time series satellite remote sensing analysis process and method to analyze and evaluate ecological environmental impacts such as erosion and deposition changes, shoreline changes and water area morphologic changes of channel projects, and performing tracking and monitoring of easily identifiable target project construction details, comparison of project impact scope consistency and project implementation effect evaluation, thereby realizing tracking of spatial-temporal changes of impacts, specifically comprising analysis steps of determining analysis areas, selecting remote sensing data sources, preprocessing remote sensing data, extracting water body information, evaluating impacts of different research scales, identifying channel projects, and tracking project construction and impacts; and 2.6 the method for analyzing and evaluating a superimposed and cumulative impact model comprises developing, based on mechanism analysis of ecological environmental impacts of channel projects, a quantitative model of superimposed and cumulative impacts to analyze and evaluate a superimposed cumulative area and impact of suspended solids (SS) concentration exceeding a standard in water caused by construction operations, as well as the superimposed cumulative mortality and impact on benthic organisms caused by the construction operations, thus realizing the combination of qualitative and quantitative impact analysis.

2. The method according to claim 1, wherein the superimposed and cumulative impact quantitative model of the method for analyzing and evaluating a superimposed and cumulative impact model is shown in equations 1 and 2:

$$WFF=\Sigma WFFi=\Sigma(ADi\times TF(QFAi\times YDi\times FDFi+BIDAi\times QIFAi\times YIDi\times FIDFi)) \quad \text{equation 1};$$

$$ASS=\Sigma ASSi=\Sigma(DSSi\times WSSi\times Ni+AWi) \quad \text{equation 2};$$

in equation 1, WFF is a superimposed and cumulative benthic organism mortality caused by channel project operations; WFFi is a benthic organism mortality caused by an i-th operation mode; ADi is a direct injury area caused by the i-th operation mode; QFAi is a density of benthic organisms in the direct injury area caused by the i-th operation mode; TF is an annual harvest season of benthic organisms; YDi is the recovery time for a direct injury impact of the i-th operation mode; FDFi is a death percentage of benthic organisms subjected to direct injury caused by the i-th operation mode; BIDAi is a ratio of an indirect disturbance affected area to a direct injury affected area by the i-th operation mode; QIFAi is a density of benthic organisms in the indirect disturbance affected area caused by the i-th operation mode; YIDi is the recovery time for an indirect injury impact of the i-th operation mode; FIDFi is a death percentage of benthic organisms affected by indirect disturbance caused by the i-th operation mode;

in equation 2, ASS is an area with superimposed and cumulative SS exceeding the standard due to channel project operations; ASSi is an area with SS exceeding the standard due to the i-th operation mode; DSSi is a longitudinal transmission distance of the area with SS exceeding the standard due to the i-th operation mode; WSSi is a transverse diffusion range of the area with SS exceeding the standard due to the i-th operation mode; Ni is the number of section constructions for the i-th operation mode; and AWi is a water area occupied by the i-th operation mode.

* * * * *